(12) United States Patent
Panayil et al.

(10) Patent No.: US 7,265,036 B2
(45) Date of Patent: Sep. 4, 2007

(54) DEPOSITION OF NANO-CRYSTAL SILICON USING A SINGLE WAFER CHAMBER

(75) Inventors: Sheeba J. Panayil, Santa Clara, CA (US); Ming Li, Cupertino, CA (US); Shulin Wang, Campbell, CA (US); Jonathan C. Pickering, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/898,094

(22) Filed: Jul. 23, 2004

(65) Prior Publication Data

US 2006/0019469 A1    Jan. 26, 2006

(51) Int. Cl.
*H01L 21/20* (2006.01)
(52) U.S. Cl. .................. 438/488; 438/758; 977/814
(58) Field of Classification Search ............ 438/97, 438/197, 211, 257, 263–266, 488, 758, 764, 438/767; 427/255.23, 255.27–25; 977/707, 977/721, 814
See application file for complete search history.

(56) References Cited

U.S. PATENT DOCUMENTS

| | | | |
|---|---|---|---|
| 5,576,059 A | 11/1996 | Beinglass et al. | |
| 5,677,235 A * | 10/1997 | Hasebe et al. | 438/488 |
| 6,090,666 A | 7/2000 | Ueda et al. | |
| 6,165,842 A | 12/2000 | Shin et al. | |
| 6,281,141 B1 * | 8/2001 | Das et al. | 438/770 |
| 6,297,095 B1 | 10/2001 | Muralidhar et al. | |
| 6,310,376 B1 | 10/2001 | Ueda et al. | |
| 6,574,144 B2 | 6/2003 | Forbes | |
| 6,726,955 B1 | 4/2004 | Wang et al. | |
| 6,784,103 B1 * | 8/2004 | Rao et al. | 438/680 |
| 2003/0189208 A1 | 10/2003 | Kam et al. | |
| 2003/0207547 A1 | 11/2003 | Shulin et al. | |
| 2004/0043583 A1 | 3/2004 | Rajesh et al. | |

FOREIGN PATENT DOCUMENTS

EP    1 420 461    5/2004

OTHER PUBLICATIONS

Kwangseok Han, et al., *Characteristics of P-Channel Si Nano-Crystal Memory*, Memory R&D Division of Hyundai Electronics Co., Ltd., 2000 IEEE, IEDM 00-309-00.312 (4 pp.).
PCT International Search Report, Application No. PCT/US2005/024921, mailed Nov. 11, 2005, 8 pgs.
PCT Written Opinion Report, Application No. PCT/US2005/024921, mailed Nov. 11, 2005, 6 pgs.

* cited by examiner

*Primary Examiner*—Brook Kebede
(74) *Attorney, Agent, or Firm*—Blakely, Sokoloff, Taylor & Zafman

(57) ABSTRACT

Numerous embodiments of a method for depositing a layer of nano-crystal silicon on a substrate. In one embodiment of the present invention, a substrate is placed in a single wafer chamber and heated to a temperature between about 300° C. to about 490° C. A silicon source is also fed into the single wafer chamber.

17 Claims, 5 Drawing Sheets

DEPOSITION OF NANO-CRYSTAL SILICON USING A SINGLE WAFER CHAMBER

TECHNICAL FIELD

Embodiments of the present invention relate to the field of semiconductor processing and more specifically, to a method and apparatus for controlling the crystal structure of a silicon film.

BACKGROUND

Polysilicon films formed by Chemical Vapor Deposition (CVD) have wide use in the fabrication of integrated circuits such as microprocessors and memory devices. Polysilicon film deposition processes require adequate physical, chemical, and production-worthy properties. For example, production-worthy properties include uniform thickness and composition for the polysilicon film (e.g., within wafer and wafer-to-wafer), low particulate and chemical contamination, and high throughput for manufacturing. When these properties are met, high electrical performance, reliable, and high yield device wafers can be manufactured at low cost.

In a CVD process, a given composition and flow rate of reactant gases and diluent inert gases are introduced into a reaction chamber containing multiple substrates (e.g., batch furnace). The gas species move to the substrate and the reactants are absorbed on the substrate. The atoms undergo migration and chemically react resulting in a film (e.g., polysilicon) being deposited on the substrate. The un-reacted gases and gaseous by-products of the reaction are desorbed and removed from the reaction chamber. Energy to drive the reactions can be supplied by several methods, (e.g. thermal, photons, catalysis, or plasma). A conventional CVD system typically includes gas sources, gas feed lines, mass-flow controllers, a reaction chamber, a method for heating substrates onto which the film is to be deposited, and temperature sensors. A conventional thermal CVD system utilizes temperature as the primary driver for the reaction of source gases.

In one type of CVD system for polysilicon deposition, a batch of silicon wafers are vertically positioned in a wafer boat for deposition and inserted into a tube-shaped furnace. The wafers are radiantly heated (above 600° C.) by resistive heating coils in the tube. Reactant gases are metered into one end of the tube (e.g., gas inlet) using a mass flow controller. Reaction by-products are pumped out the other end of the tube (e.g., via an exhaust pump).

As semiconductor technology advances, there is a requirement for film deposition to occur at lower and lower temperatures to enable, for example, ultra shallow junctions for sub-100 nanometer (nm) devices. The formation of nano-crystal silicon structures within a film depends on the controlling the size and density of the nano-crystal silicon. One problem with batch furnace systems is that they cannot accommodate nano-crystal film deposition at low temperatures (e.g., below 500° C.). Another problem with batch furnace systems is that they exhibit a disadvantage known as "depletion effects." Depletion effects reduce gas phase concentrations as reactants are consumed by reactions on wafer surfaces. As such, wafers near the inlet are exposed to higher concentrations of reactant gases. Deposition rates are thus greater for wafers placed near the inlet and uniform thickness is difficult to obtain.

SUMMARY

Embodiments of a method for depositing a layer of nano-crystal silicon on a substrate are described. In one embodiment of the present invention, a substrate is placed in a single wafer chamber and heated to a temperature between about 300° C. to about 490° C. A silicon source is also fed into the single wafer chamber. In an alternative embodiment, a pressure between about 10 Torr to about 350 Torr is generated in the single wafer chamber.

BRIEF DESCRIPTION OF THE DRAWINGS

Embodiments of the present invention are illustrated by way of example, and not limitation, in the figures of the accompanying drawings in which:

FIG. 5b illustrates one embodiment of nano-crystal silicon formed on the substrate of FIG. 5a.

DETAILED DESCRIPTION

In the following description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

The terms "on," "above," "below," "between," and "adjacent" as used herein refer to a relative position of one layer or element with respect to other layers or elements. As such, a first element disposed on, above or below another element may be directly in contact with the first element or may have one or more intervening elements. Moreover, one element disposed next to or adjacent another element may be directly in contact with the first element or may have one or more intervening elements.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Embodiments of depositing and/or forming nano-crystal silicon films on a substrate are described. In one embodiment of the present invention, the process environment for forming the nano-crystal silicon film may be a single wafer deposition chamber, in which a CVD deposition method such as low pressure chemical vapor deposition (LPCVD) is used to form a nano-crystal silicon film on a substrate. The growth rate of the nano-crystal silicon film may be controlled to a desired level to form the silicon film with a particular density and dimension, wafer-to-wafer repeatability, and low thermal budget. The single wafer deposition chamber provides the advantage of precisely maintaining a desired deposition temperature as well as pressure control during nano-crystal silicon deposition. In one embodiment, the nano-crystal silicon film may be discontinuous, and both doped and undoped nano-crystal silicon formation may be achieved with the single wafer chamber. In another embodiment, the relative low deposition temperature results in an amorphous nano-crystal silicon layer. Embodiments of the present invention are advantageous over prior art methods for forming nano-crystal silicon layers that involve multiple steps (e.g., amorphous silicon deposition followed by an annealing process to recrystalize the amorphous silicon into nano-crystals). In one embodiment of the present invention, nano-crystal silicon formation may be achieved in a single step as carried out in a deposition chamber.

Figure 1:
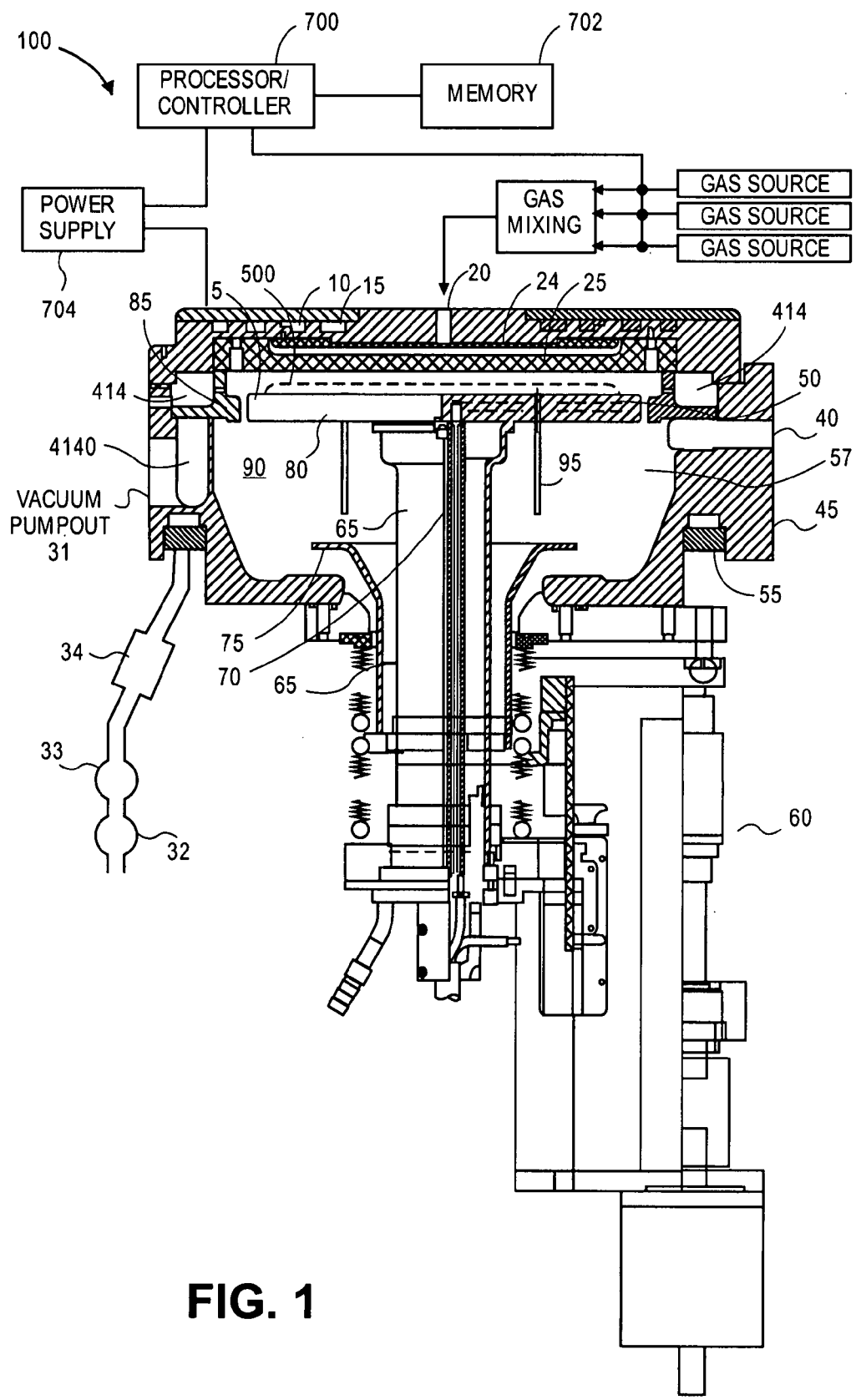
FIG. 1 illustrates a cross-sectional side view of one embodiment of a processing chamber having a resistive heater in a "wafer-process" position through a first cross-section and a second cross-section, each through one-half of the chamber.
Figure 2:
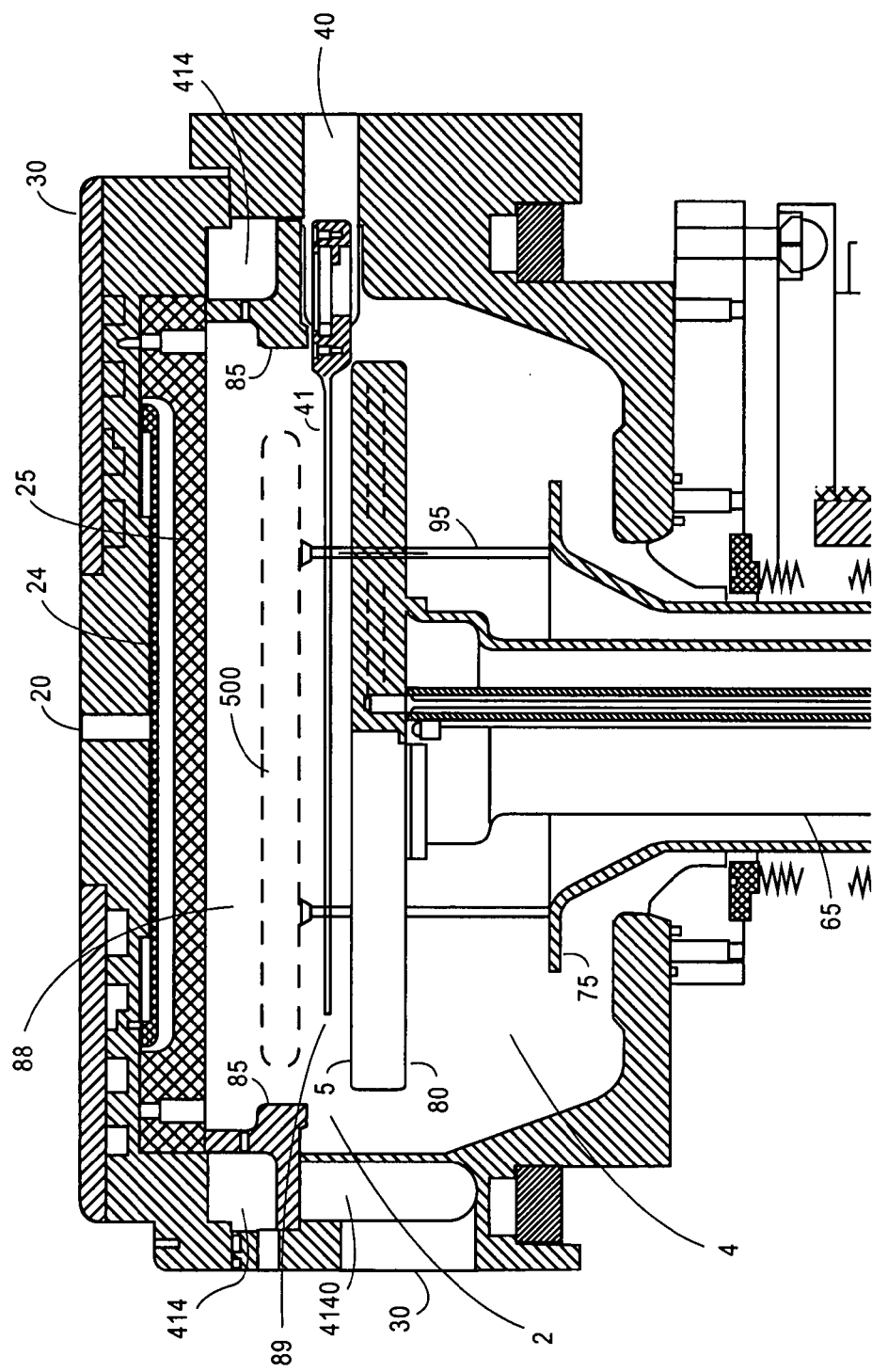
FIG. 2 illustrates a similar cross-sectional side view as in FIG. 1 in a "wafer separate" position.
Figure 3:
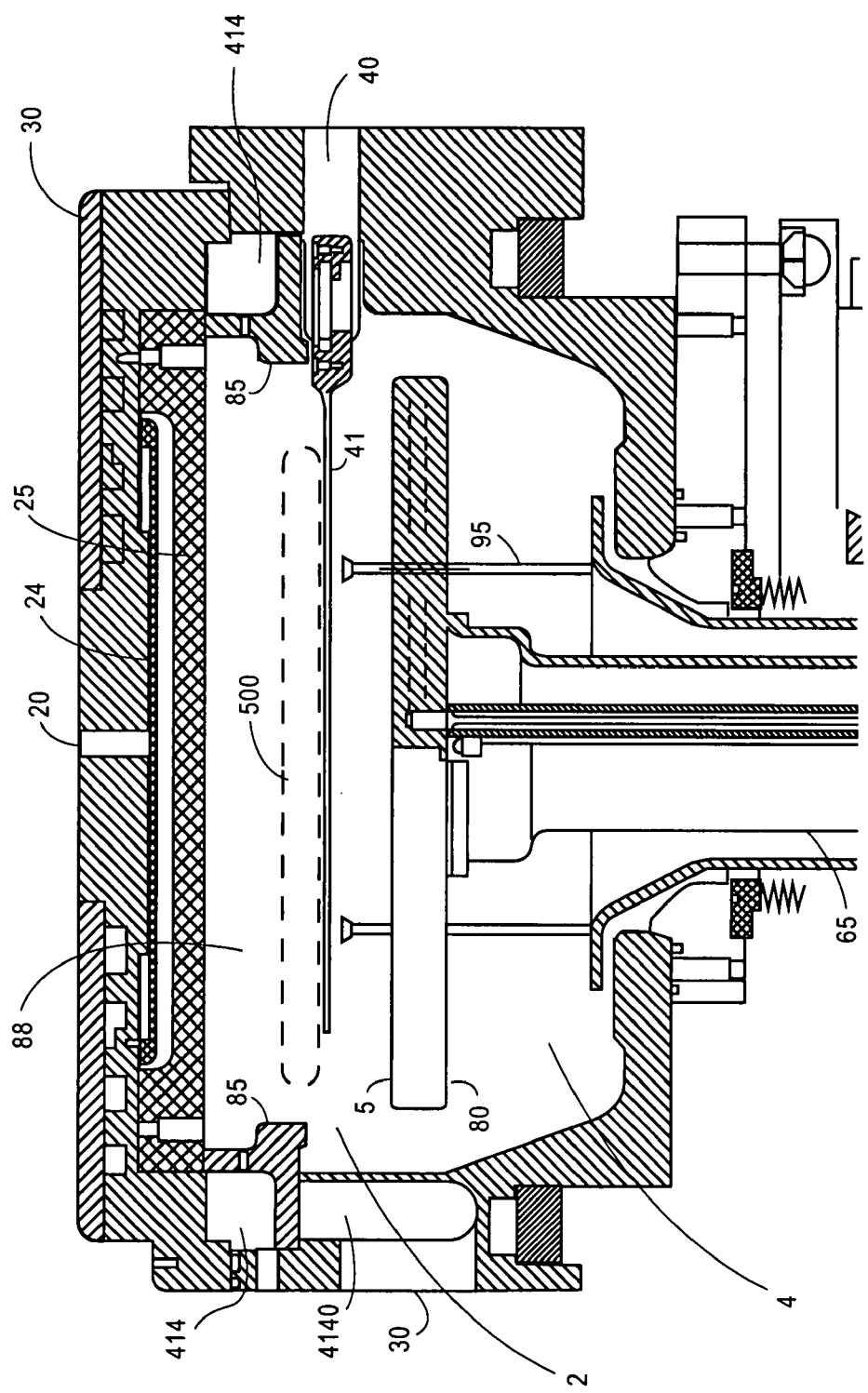
FIG. 3 illustrates an illustration of a similar cross-sectional side view as in FIG. 1 in a "wafer load" position.

The deposition of nano-crystal silicon on a substrate may be achieved by the reaction of vapor-phase chemicals (i.e., reactants) that contain the required constituents (e.g., silicon precursors). The reactant gases are introduced into a reaction chamber and are decomposed and/or reacted at a heated surface of a substrate to form the nano-crystal silicon film. In one embodiment, the reaction chamber may be one that accommodates only one substrate or wafer at a time. FIGS. 1-3 illustrate one embodiment of an apparatus that may be used to practice embodiments of the present invention. In one particular embodiment, the apparatus may be a LPCVD chamber 100. FIGS. 1-3 each show cross-sectional views through two different cross-sections, each cross-section representing a view through approximately one-half of LPCVD chamber 100, of one type of reactor such as a resistive reactor. The LPCVD chamber 100 illustrated in FIGS. 1-3 is constructed of materials to maintain, in one embodiment, to provide a deposition chamber pressure between about 10 Torr to about 350 Torr. For the purpose of illustration, LPCVD chamber 100 may have a chamber volume of about 5-6 liters. As described in greater detail below, FIG. 1 illustrates the inside of process chamber body 45 in a "wafer-process" position, FIG. 2 illustrates the same view of the chamber in a "wafer-separate" position, and FIG. 3 illustrates the same cross-sectional side view of chamber body 45 in a "wafer-load" position. In each illustration, a wafer 500 is indicated in dashed lines to indicate its location in LPCVD chamber 100. In one embodiment, LPCVD chamber 100 is adapted to hold one wafer only (i.e., a single wafer chamber). Chamber body 45 may also be sized to accommodate a wafer having a diameter between about 200 mm to about 300 mm.

FIGS. 1-3 illustrate chamber body 45 that defines reaction chamber 90 in which the thermal decomposition of a process gas or gases takes place to form a nano-crystal silicon film on wafer 500. Chamber body 45 is constructed, in one embodiment, of aluminum and has a passage 55 for water to be pumped therethrough, for example, within the chamber walls, to isolate the reaction area around wafer 500 and prevent deposition on the inside walls of chamber 45. In one embodiment, LPCVD chamber 100 may be a "cold-wall" reaction chamber. Resident in reaction chamber 90 is resistive heater 80 including, in this view, susceptor 5 supported by shaft 65. Susceptor 5 has a surface area sufficient to support a substrate such as a semiconductor wafer 500 (shown in dashed lines). Wafer 500 may be any surface, generated when making an integrated circuit, upon which a conductive layer may be formed. Wafer 500 thus may include, for example, active and passive devices that are formed on a silicon wafer such as transistors, capacitors, resistors, diffused junctions, gate electrodes, local interconnects, etc.

FIG. 1 also illustrates a cross-sectional view of a portion of heater 80, including a cross-section of the body of susceptor 5 and a cross-section of shaft 65. In this illustration, FIG. 1 illustrates the body of susceptor 5 having two heating elements formed therein, first heating element 50 and second heating element 57. Each heating element (e.g., heating element 50 and heating element 57) is made of a material with thermal expansion properties similar to the material of susceptor 5. In one embodiment, the material for susceptor 5 may be molybdenum (Mo), or other heating elements known in the art. In one embodiment, first and second heating elements 50, 57 include a thin layer of molybdenum material in a coiled configuration. The dual heater system of LPCVD chamber 100 provides the advantage of allowing for precise control of the deposition temperature for nano-crystal silicon. In an alternative embodiment, LPCVD chamber 100 may include lamp heaters instead of the resistive type heaters described above with respect to heating elements 50 and 57.

One advantage of the nano-crystal silicon deposition methods described herein is that the deposition temperature is relatively low (e.g., below 500° C.). In one embodiment, the deposition temperature in LPCVD chamber 100 is between about 300° C. to about 490° C. In one embodiment, the deposition temperature may be referred to as the measured or set temperature of susceptor 5. In an alternative embodiment, the deposition temperature may be referred to as the measured or set temperature of first and second heating elements 50, 57 or heater 80. The deposition environment provided by LPCVD chamber 100 allows for the precise controlling of temperature and pressure, which are important factors for the formation of nano-crystal silicon on wafer 500. Because nano-crystal silicon formation occurs at relatively low temperature, maintaining a precise deposition temperature may be critical. In one embodiment, heater 80 with heating elements 50 and 57 allow for precise temperature control and stability. The passage of process gas through blocker plate 24 and perforated face plate 25 provides the advantage of uniform gas distribution towards wafer 500. In one embodiment, materials for reaction chamber 90 are compatible with the process gases and other chemicals, such as cleaning chemicals (e.g., nitrogen trifluoride, $NF_3$) that may be introduced into reaction chamber 90.

The exposed surfaces of heater 80 may be comprised of a variety of materials provided that the materials are compatible with the process. For example, susceptor 5 and shaft 65 of heater 80 may be comprised of similar aluminum nitride material. Alternatively, the surface of susceptor 5 may be comprised of high thermally conductive aluminum nitride materials (on the order of about 95% purity with a thermal conductivity from about 140 W/mK, in one embodiment) while shaft 65 is comprised of a lower thermally conductive aluminum nitride. In one embodiment, susceptor 5 of heater 80 may be coupled to shaft 65 through diffusion bonding or brazing, because this type of coupling may withstand the environment of reaction chamber 90.

In FIG. 1, second heating element 57 is formed in a plane of the body of susceptor 5 that is disposed inferior (relative to the surface of susceptor 5 in the figure) to first heating element 50. First heating element 50 and second heating element 57 are separately coupled to power terminals. The power terminals extend in an inferior direction as conductive leads through a longitudinally extending opening through shaft 65 to a power source that supplies the requisite energy to heat the surface of susceptor 5. Extending through openings in chamber lid are two pyrometers, first pyrometer 10 and second pyrometer 15. Each pyrometer provides data about the temperature at the surface of susceptor 5 (or at the surface of a wafer on susceptor 5). Also of note in the cross-section of heater 80 as shown in FIG. 1 is the presence of thermocouple 70. Thermocouple 70 extends through the longitudinally extending opening through shaft 65 to a point just below the superior or top surface of susceptor 5.

Process gas enters otherwise sealed reaction chamber 90 through gas distribution port 20 in a top surface of chamber lid 30 of chamber body 45. The process gas then goes through blocker plate 24 to distribute the gas about an area consistent with the surface area of a wafer. Thereafter, the process gas is distributed through perforated face plate 25 located, in this view, above resistive heater 80 and coupled to chamber lid 30 inside reaction chamber 90. In one embodiment, the combination of blocker plate 24 with face plate 25 creates a uniform distribution of process gas near a top surface of wafer 500.

As illustrated, wafer 500 is placed in reaction chamber 90 on susceptor 5 of heater 80 through entry port 40 in a side portion of chamber body 45. To accommodate a wafer for processing, heater 80 is lowered so that the surface of susceptor 5 is below entry port 40 as illustrated in FIG. 3. In one embodiment, with a robotic transfer mechanism, wafer 500 may be loaded by way of, for example, a transfer blade 41 into reaction chamber 90 onto the superior surface of susceptor 5. Once loaded, entry 40 is sealed and heater 80 is advanced in a superior (e.g., upward) direction toward face plate 25 by lifter assembly 60 that is, for example, a step motor (as illustrated in FIG. 1). The advancement stops when the wafer 500 is a short distance (e.g., 400-700 mils) from face plate 25 (see FIG. 1). In the wafer-process position of FIG. 1, reaction chamber 90 is effectively divided into two zones, a first zone 2 above the superior surface of susceptor 5 and a second zone 4 below the inferior surface of susceptor 5.

With wafer 500 disposed within reaction chamber 90, first zone 2 includes an area 88 above wafer 500 such that nano-crystal silicon film/layer formation is confined to an upper surface (i.e., the area below perforated face plate 25). That is, nano-crystal silicon film deposition is limited to one side of wafer 500. In one embodiment, area 88 defines a partial pressure area in reaction chamber 90 (i.e., (flow rate of precursor/total flow) x chamber pressure) for a gas source such as a silicon precursor. In an alternative embodiment, nano-crystal silicon formation may be accomplished in both the first and second zones for silicon film deposition on both sides of wafer 500. Accordingly, area 88 and area 89, corresponding to the top and bottom surfaces of wafer 500, defines the partial pressure area for dual sided silicon film deposition.

At this point, process gas controlled by a gas panel flows into reaction chamber 90 through gas distribution port 20, through blocker plate 24 and perforated face plate 25. Process gas thermally decomposes to form a film on the wafer. At the same time, an inert bottom-purge gas, e.g., nitrogen, is introduced into the second chamber zone to inhibit film formation in that zone. In a pressure controlled system, the pressure in reaction chamber 90 is established and maintained by a pressure regulator or regulators (not shown) coupled to reaction chamber 90. In one embodiment, for example, the pressure is established and maintained by baratron pressure regulator(s) coupled to chamber body 45 as known in the art. In one embodiment, the baratron pressure regulator(s) maintains pressure at a level between about 10 Torr to about 350 Torr for the deposition of nano-crystal silicon on wafer 500.

Residual process gas is pumped from reaction chamber 90 through pumping plate 85 to a collection vessel at a side of chamber body 45 (vacuum pumpout 31). Pumping plate 85 creates two flow regions resulting in a gas flow pattern that forms a nano-crystal silicon layer on wafer 500.

Pump 32 disposed exterior to apparatus provides vacuum pressure within pumping channel 4140 (below channel 414 in FIGS. 1-3) to draw both the process and purge gases out of the reaction chamber 90 through vacuum pump-out 31. The gas is discharged from reaction chamber 90 along a discharge conduit 33. The flow rate of the discharge gas through channel 4140 is preferably controlled by a throttle valve 34 disposed along conduit 33. In one embodiment, the pressure within processing reaction chamber 90 is monitored with sensors (not shown) and controlled by varying the cross-sectional area of conduit 33 with throttle valve 34. Preferably, a controller or processor (also not shown) receives signals from the sensors that indicate the chamber pressure and adjusts throttle valve 34 accordingly to maintain the desired pressure within reaction chamber 90.

Once processing of wafer 500 is complete, reaction chamber 90 may be purged, for example, with an inert gas, such as nitrogen. After processing and purging, heater 80 is advanced in an inferior direction (e.g., lowered) by lifter assembly 60 to the position shown in FIG. 2. As heater 80 is moved, lift pins 95, having an end extending through openings or throughbores in a surface of susceptor 5 and a second end extending in a cantilevered fashion from an inferior (e.g., lower) surface of susceptor 5, contact lift plate 75 positioned at the base of reaction chamber 90. As illustrated in FIG. 2, in one embodiment, lift plate 75 remains at a wafer-process position (i.e., the same position as illustrated in FIG. 1). As heater 80 continues to move in an inferior direction through the action of assembly 60, lift pins 95 remain stationary and ultimately extend above the susceptor or top surface of susceptor 5 to separate a processed wafer 500 from the surface of susceptor 5. The surface of susceptor 5 is moved to a position below entry port 40.

Once a processed wafer 500 is separated from the surface of susceptor 5, transfer blade 41 of a robotic mechanism is inserted through opening 40 beneath the heads of lift pins 95 and wafer 500 is supported by lift pins 95. Next, lifter assembly 60 inferiorly moves (e.g., lowers) heater 80 and lift plate 75 to a "wafer load" position. By moving lift plates 75 in an inferior direction, lift pins 95 are also moved in an inferior direction, until the surface of the processed wafer 500 contacts transfer blade 41. The processed wafer 500 is then removed through entry port 40 by, for example, a robotic transfer mechanism that removes wafer 500 and transfers wafer 500 to the next processing step. A second wafer (not shown) may then be loaded into reaction chamber 90. The steps described above are generally reversed to bring wafer 500 into a process position.

Single wafer LPCVD chamber 100 includes a processor/controller 700 and a memory 702, such as a hard disk drive. The processor/controller 700 may include a single board (SBC) analog and digital input/output boards, interface boards and stepper motor controller board and is coupled to power supply 704. Processor/controller 700 controls all activity of LPCVD chamber 100. Controller 700 executes system control software, which is a computer program stored in a computer readable medium such as memory 702.

The computer readable medium includes any mechanism that provides (i.e., stores and/or transmits) information in a form accessible by a machine (i.e., a computer, network device, personal digital assistant, manufacturing tool such as a single wafer deposition chamber, any device with a set of one or more processors, etc.). For example, a computer readable medium includes recordable/non-recordable media (e.g., read only memory (ROM); random access memory (RAM); magnetic disk storage media; optical storage media; flash memory devices, etc.), as well as electrical, optical, acoustical or other form of propagated signals (e.g., carrier waves, infrared signals, digital signals, etc.).

The computer program includes sets of instructions that dictate the timing, mixture of gases, chamber pressure, heater temperature, power supply (e.g., 704), susceptor position, and other parameters of the nano-crystal silicon deposition process. The computer program code can be written in any conventional computer readable programming language such as 68000 assembly language, C, C++, Pascal, Fortran, or others. Subroutines for carrying out process gas mixing, pressure control, and heater control may be stored within memory 702. Memory 702 also stores process parameters such as process gas flow rates and compositions, temperatures, and pressures necessary to form a nano-crystal silicon film, for example, having a discontinuous grain structure. In one embodiment, LPCVD chamber 100 includes in memory 702 instructions and process parameters for providing a silicon source gas and a carrier gas mix into reaction chamber 90, heating the susceptor 5 to a temperature between about 300° C. to about 490° C., and generating a pressure between about 10 Torr to about 350 Torr within reaction chamber 90 so that a nano-crystal silicon film may be deposited by thermal chemical vapor deposition onto wafer 500.

Figure 4:
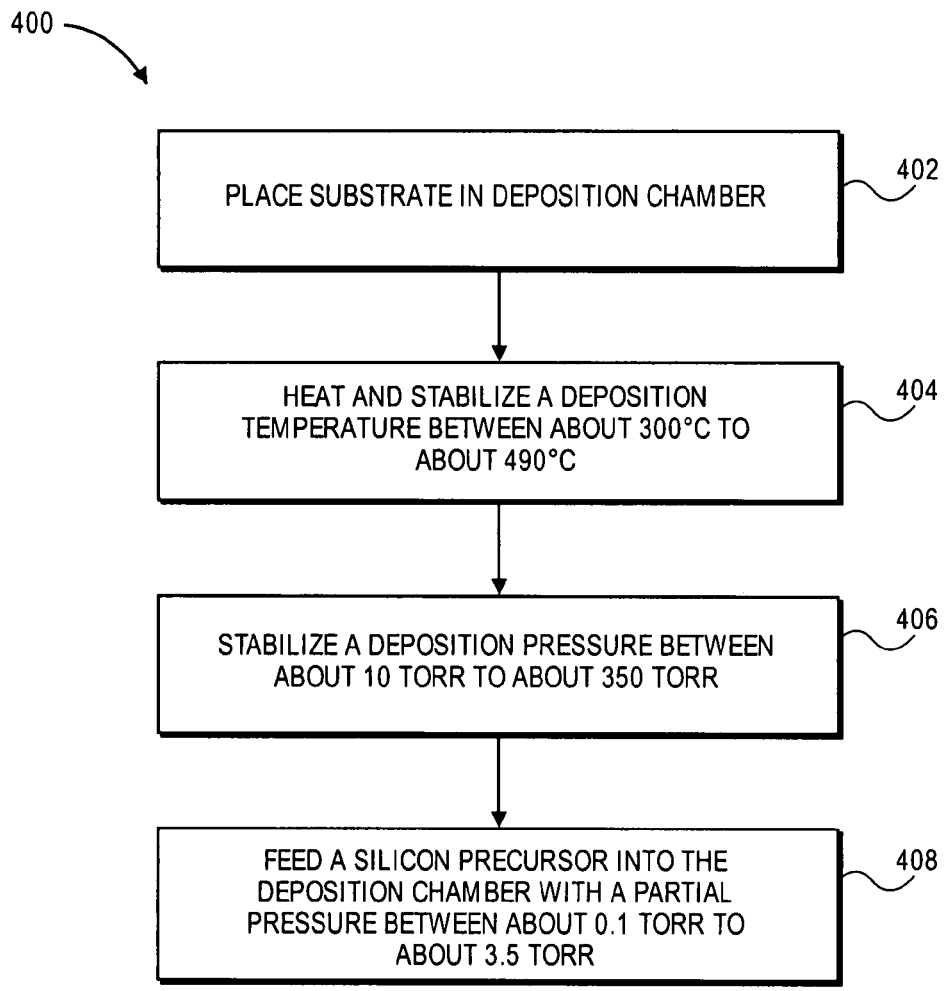
FIG. 4 illustrates a block diagram of one embodiment of a method for depositing a discontinuous layer of nano-crystal silicon film on a substrate.
Figure 5A:
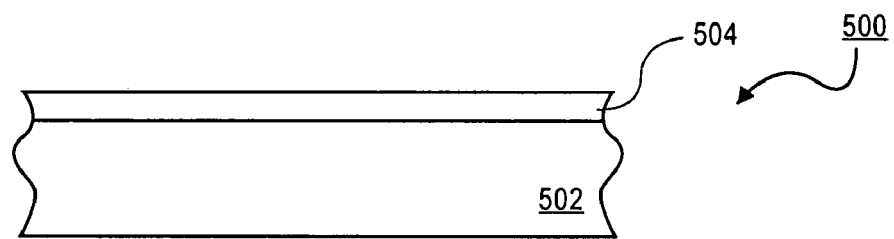
FIG. 5a illustrates one embodiment of a substrate having a dielectric formed on a silicon wafer.

FIG. 4 illustrates a block diagram of one embodiment of a method for depositing a discontinuous layer of nano-crystal silicon film on a substrate, also with respect to the single wafer LPCVD chamber (e.g., 100) of FIGS. 1-3. As set forth in block 402 of diagram 400, a wafer or substrate (e.g., wafer 500) is placed in deposition chamber (e.g., single wafer deposition chamber 90). In one embodiment of the present invention, where the deposited nano-crystal silicon film is to be used as a gate electrode for a transistor of a semiconductor integrated circuit, the wafer may be a doped silicon wafer 502 having a gate dielectric layer 504, such as silicon oxide or silicon oxynitride formed thereon as illustrated in FIG. 5a. Examples of dopants include, but are not limited to, germane ($GeH_4$), phosphine ($PH_3$), and diborane ($B_2H_6$). In one embodiment, the silicon precursor gas may include a dopant in situ so that a separate doping procedure is not required (i.e., the dopant is delivered with the carrier gas). If the nano-crystal silicon film is used as an interconnect or capacitor electrode, then the nano-crystal silicon film may be formed over an interlayer dielectric 504 formed over a doped silicon wafer 502. The wafer is transferred into the chamber by a transfer blade (e.g., 41) as shown in FIG. 3. A heater (e.g., heater 80) is then raised from the wafer load position to the wafer process position as shown in FIG. 1.

Next, as set forth in blocks 404 and 406, the desired deposition temperature and pressure are obtained and stabilized in the chamber. In one embodiment, the deposition temperature of the chamber may be between about 300° C. to about 490° C. The deposition pressure of the chamber may be set to a pressure between about 10 Torr to about 350 Torr. Depending on the particular precursor gas used, as described in greater detail below, a preferred temperature may be between about 400° C. to about 475° C., and a preferred pressure may be between about 30 Torr to about 350 Torr. Next, a flowing carrier gas or dilution gas may be introduced into the chamber. In one embodiment, the carrier or dilution gas may be nitrogen or argon.

Figure 5B:
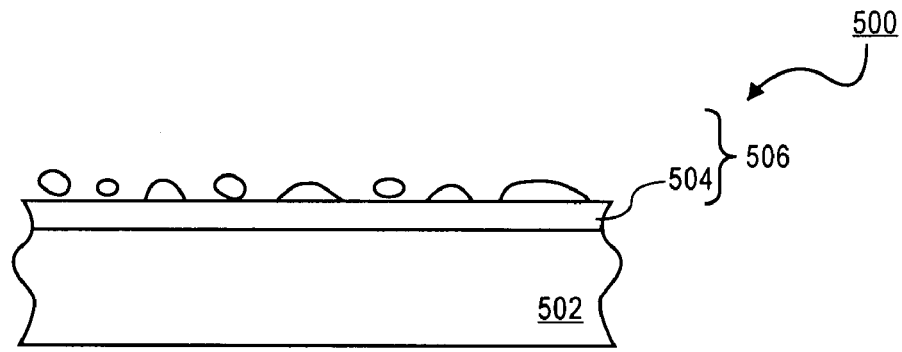

Next, once the temperature, pressure, and gas flows have been stabilized, a silicon source (i.e., precursor) is fed into the chamber with a carrier gas (e.g., nitrogen, helium, argon) with a partial pressure of about 0.1 Torr to about 3.5 Torr, block 408. The silicon source and carrier gas are fed into the chamber to deposit a nano-crystal silicon film 506 on substrate 500 as shown in FIG. 5b. The flow of the silicon source is limited to area 88 above the top surface of wafer 500 for deposition of nano-crystal silicon on one side of wafer 500. In one embodiment of the present invention, the silicon source may be a gas such as silane ($SiH_4$), or alternatively other silicon source gases such as disilane ($Si_2H_6$), trisilane ($Si_3H_8$), and bis-tertiarybutylamino silane (BTBAS, ($C_8H_{22}N_2Si$)). In one embodiment, the carrier gas may be a mixture that includes $H_2$ and an inert gas (e.g., nitrogen, helium, argon). In one example, silane is fed into the chamber between about 50 standard cubic centimeters per minute (sccm) to about 150 sccm, while the deposition temperature (i.e., the temperature of heater 80) in chamber 90 is maintained at a steady temperature between about 440° C. to about 490° C. and a deposition pressure of about 150 Torr to about 350 Torr. Another important process parameter includes the partial pressure of the silane precursor. As discussed above, the partial pressure for a silicon precursor gas is measured for area 88 above wafer 500. In one embodiment, the partial pressure for silane may be between about 0.5 to about 3.5 Torr.

For disilane, this silicon precursor gas is fed into chamber 90 between about 50 sccm to about 150 sccm, while the deposition temperature in chamber 90 is maintained at a steady temperature between about 425° C. to about 475° C., and a deposition pressure of about 30 Torr to about 225 Torr. The partial pressure of the disilane precursor may be between about 0.1 Torr to about 3.0 Torr. For trisilane, this precursor gas is fed into chamber 90 between about 200 sccm to about 350 sccm, while the deposition temperature in chamber 90 is maintained at a steady temperature that is between about 400° C. to about 450° C., and a deposition pressure of about 30 Torr to about 200 Torr. The partial pressure of the trisilane precursor may be between about 0.1 Torr to about 2.5 Torr. In one embodiment of the present invention, the silicon source gas is added to the first component (upper component) of the carrier gas mix and flows into reaction chamber 90 through inlet port 20.

In an alternative embodiment, a precursor gas may be fed into reaction chamber 90 on both sides of wafer 500 for nano-silicon crystal formation (i.e., simultaneous deposition of nano-crystal silicon through areas 88 and 89 of chamber 90). A silane precursor gas may be fed into chamber 90 between about 120 sccm to about 180 sccm, while the deposition temperature in chamber 90 is maintained between about 475° C. to about 525° C., and a partial pressure (with area defined by areas 88, 89) between about 0.8 Torr to about 1.2 Torr. A disilane precursor gas may be fed into chamber 90 between about 10 sccm to about 25 sccm, with a deposition temperature in chamber 90 is between about 450° C. to about 500° C., and a partial pressure between about 0.08 Torr to about 1.6 Torr.

The thermal energy from a susceptor (e.g., susceptor 5) and wafer (e.g., wafer 500 or wafer 502) disposed within the chamber causes the silicon source gas to thermally decompose and deposit a discontinuous and amorphous nano-crystal silicon film on gate dielectric or interlayer dielectric 504 disposed above silicon wafer 502 as shown in FIG. 5*b*. Although the FIG. 5*b* is illustrated in a simplified form for clarity of explanation, the layer of nano-crystal silicon, in one embodiment, may have a density of greater than about 1E10 crystal/cm2 and an average grain diameter of less than about 5 nanometers. In one embodiment of the present invention, only thermal energy is used to decompose the silicon source gas without the aid of additional energy sources such as plasma or photon enhancement. One advantage of a gate electrode formed from nano-crystal silicon is that the nano-scale particles have a larger bandgap than larger, bulk silicon due to confinement in the small particles.

In one embodiment of the present invention, the deposition pressure, temperature, and process gas flow rates and concentration are chosen so that a nano-crystal silicon film is deposited at a deposition rate in the range of about 5 Å/min (Angstroms per minute) to about 15 Å/min. The deposition rate may depend on the process chemistry, temperature, or pressure. For example, silane may be deposited at a rate of about 5 Å/min based on a deposition temperature between about 440° C. to about 490° C., a deposition pressure of about 150 Torr to about 350 Torr, and a partial pressure of about 0.5 Torr to about 3.5 Torr. The process gas mix is continually fed into the chamber until a nano-crystal silicon film 506 of a desired thickness is formed.

In the foregoing specification, the invention has been described with reference to specific exemplary embodiments thereof. It will, however, be evident that various modifications and changes may be made thereto without departing from the broader spirit and scope of embodiments of the invention as set forth in the appended claims. The specification and figures are, accordingly, to be regarded in an illustrative rather than a restrictive sense.

What is claimed is:

1. A method of depositing a layer of nano-crystal silicon on only one surface of a substrate, comprising:
    placing the substrate in a single wafer chamber;
    feeding a silicon precursor above the substrate at a deposition temperature between about 300° C. to about 490° C.; and, at the same time as feeding the silicon precursor,
    generating a deposition pressure between about 10 to about 350 Torr to control a deposition rate and crystal density during deposition of the layer of nano-crystal silicon on a first surface of the substrate; and, at the same time as generating the deposition pressure,
    feeding an inert bottom-purge gas below the substrate to inhibit deposition of nano-crystal silicon on a second surface of the substrate.

2. The method of claim 1, wherein feeding the silicon precursor further comprises adding a nitrogen carrier gas to the silicon precursor.

3. The method of claim 2, wherein feeding the silicon precursor further comprises feeding silane with a partial pressure between about 0.5 Torr to about 3.5 Torr.

4. The method of claim 2, wherein feeding the silicon precursor further comprises feeding disilane with a partial pressure between about 0.1 Torr to about 3.0 Torr.

5. The method of claim 1, wherein feeding the silicon precursor further comprises maintaining the temperature with a dual zone heater.

6. The method of claim 1, wherein feeding the silicon precursor further comprises adding a dopant to the silicon precursor in situ.

7. The method of claim 1, wherein feeding the silicon precursor further comprises passing the silicon precursor into the single wafer chamber at a rate between about 50 sccm to about 150 sccm.

8. The method of claim 1, wherein depositing the layer of nano-crystal silicon on the substrate is controlled with a deposition rate of about 5Å/min to about 15Å/min.

9. The method of claim 1, wherein the deposition pressure provides a nano-crystal film of about $1\times10^{10}$ crystals/cm$^2$ or greater in density and about 5 nm or less in grain size.

10. The method of claim 1 wherein the inert bottom-purge gas is nitrogen.

11. A method of depositing nano-crystal silicon, comprising:
    feeding a silicon precursor above a substrate to form a nano-crystal silicon layer on a first surface of said substrate, wherein feeding said silicon precursor comprises controlling the deposition rate and the crystal density of said nano-crystal silicon layer; and, at the same time as feeding said silicon precursor,
    feeding an inert bottom-purge gas below said substrate to inhibit deposition of nano-crystal silicon on a second surface of said substrate.

12. The method of claim 11 wherein the feeding of said silicon precursor comprises feeding at a deposition temperature between about 300° C. to about 490° C.

13. The method of claim 12 wherein the feeding of said silicon precursor comprises generating a deposition pressure between about 10 to about 350 Torr.

14. The method of claim 13 wherein the inert bottom-purge gas is nitrogen.

15. The method of claim 12 wherein the feeding of said silicon precursor comprises generating a deposition pressure between about 0.1 to about 3.5 Torr.

16. The method of claim 15 wherein the inert bottom-purge gas is nitrogen.

17. The method of claim 16 wherein said nano-crystal silicon layer is a discontinuous layer.

* * * * *